United States Patent
Cheong et al.

(10) Patent No.: US 7,005,356 B2
(45) Date of Patent: Feb. 28, 2006

(54) SCHOTTKY BARRIER TRANSISTOR AND METHOD OF MANUFACTURING THE SAME

(75) Inventors: Woo Seok Cheong, Daejeon (KR); Seong Jae Lee, Daejeon (KR); Moon Gyu Jang, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 14 days.

(21) Appl. No.: 10/746,493

(22) Filed: Dec. 23, 2003

(65) Prior Publication Data
US 2004/0206980 A1 Oct. 21, 2004

(30) Foreign Application Priority Data
Apr. 16, 2003 (KR) .................. 10-2003-0023969

(51) Int. Cl.
*H01L 21/28* (2006.01)

(52) U.S. Cl. .................. 438/300; 438/570; 438/581; 438/583; 438/585

(58) Field of Classification Search .................. 438/92, 438/167, 169, 180, 197, 230, 570, 571, 581, 438/583, 585; 257/280, 281, 282, 471
See application file for complete search history.

(56) References Cited
U.S. PATENT DOCUMENTS 3,609,477 A * 9/1971 Drangeid et al. .......... 257/284
6,303,479 B1 * 10/2001 Snyder ..................... 438/581
2003/0235936 A1 * 12/2003 Snyder et al. ............. 438/92
2004/0041226 A1 * 3/2004 Snyder et al. ............. 257/471
2004/0142524 A1 * 7/2004 Grupp et al. .............. 438/197

FOREIGN PATENT DOCUMENTS

JP          10-242464      9/1998
KR       2001-0069128      7/2001

* cited by examiner

*Primary Examiner*—Olik Chaudhuri
*Assistant Examiner*—B. V. Keshavan
(74) *Attorney, Agent, or Firm*—Blakely Sokoloff Taylor & Zafman (57) ABSTRACT

A schottky barrier transistor and a method of manufacturing the same are provided. The method includes forming a gate insulating layer and a gate on a substrate, forming a spacer on a sidewall of the gate, and growing a polycrystalline silicon layer and a monocrystalline silicon layer on the gate and the substrate, respectively, using a selective silicon growth. A metal is deposited on the polycrystalline silicon layer and the monocrystalline silicon layer. Then, the metal reacts with silicon of the polycrystalline silicon layer and the monocyrstalline silicon layer to form a self-aligned metal silicide layer. Therefore, selective wet etching for removing an unreacted metal after silicidation can be omitted. Furthermore, etching damage caused during the formation of the spacer can be decreased during the growth of the monocrystalline silicon layer, thereby improving the electrical characteristics of devices.

18 Claims, 7 Drawing Sheets

SCHOTTKY BARRIER TRANSISTOR AND METHOD OF MANUFACTURING THE SAME

BACKGROUND OF THE INVENTION

This application claims priority from Korean Patent Application No. 2003-23969, filed on Apr. 16, 2003, in the Korean Intellectual Property Office, the disclosure of which is incorporated herein by reference in its entirety.

1. Field of the Invention

The present invention relates to a transistor and a method of manufacturing the same. More particularly, the present invention relates to a schottky barrier transistor (referred to as "SB transistor", hereinafter) using a schottky barrier formed between a metal and a semiconductor, and a method of manufacturing the same.

2. Description of the Related Art

Semiconductor device fabrication technology has reached the level where it is now possible to fabricate transistors that have a short channel with a length less than 100 nm. However, integration simply by reduction in transistor size causes various problems. The most important issues are a short channel effect (SCE) due to the scaling-down of devices and a source/drain doping associated with a decrease in source/drain resistance.

In particular, the formation of a source/drain by ion implantation in a conventional transistor fabrication method is accompanied by the following problems. First, it is difficult to adjust the depth of a junction. Since diffusion of impurities occurs both in depth and channel directions, it is difficult to prevent a short channel effect. In this regard, rapid thermal process (RTP), laser annealing, solid phase diffusion (SPD), and the like have been suggested as an alternative to ion implantation. However, a channel depth of less than 10 nm for prevention of a short channel effect is difficult to attain. Second, a saturation current is unavoidably reduced. That is, as devices become more integrated, a junction becomes thinner and a sheet resistance increases, thereby reducing the saturation current. Third, high-temperature thermal treatment above 800° C. is required for activation of impurities implanted in a source/drain. Therefore, a metal gate cannot be used. Fourth, a soft error rate at a junction interface is high and a floating body effect may be caused.

In order to solve these problems, SB transistor fabrication technology using metal suicide as a material for a source/drain has been suggested. According to this technology, since problems due to source/drain doping are not caused, a source/drain resistance can be greatly reduced. In addition, a high-temperature thermal treatment process can be omitted. Therefore, this technology is compatible with a process of using a metal as a gate electrode for satisfying low power consumption/rapid processing speed of devices.

In a conventional SB transistor fabrication method, a source/drain is formed by heating a deposited metal to induce silicidation and then removing an unreacted metal by selective wet etching. The silicidation and the selective wet etching are generally known as a salicide process. However, since interest in using SB transistors as alternatives to nanoelectronic devices have been raised just recently, optimization of the structure and fabrication process of the SB transistors has still not been established. In this regard, there are needs to efficiently adjust a schottky barrier height, which greatly affects device characteristics, and at the same time, to optimize a fabrication process for ultra-small devices.

In particular, one important and difficult process in the SB transistor fabrication method is selective wet etching for removing only an unreacted metal. The degree of difficulty of the selective wet etching varies depending on the types of metals and the etching patterns. However, use of noble metals and formation of a fine pattern increase the difficulty of the selective wet etching.

Another important and difficult process in the SB transistor fabrication method is etching damage removal. In the SB transistors, interface characteristics between a metal silicide layer and a silicon substrate are very important. Etching damage caused during a formation of a spacer on a sidewall of a gate is a main factor that adversely affects the interface characteristics between the metal silicide layer and the silicon substrate. Until now, there have been no efficient solutions to the etching damage.

SUMMARY OF THE INVENTION

The present invention provides a SB transistor having optimal electrical characteristics as a result of eliminating the requirement for selective wet etching and decreasing etching damage.

The present invention also provides a method of manufacturing a SB transistor capable of eliminating the requirement for selective wet etching and decreasing etching damage.

According to an aspect of the present invention, there is provided a SB transistor. The SB transistor comprises a gate formed on a substrate with a gate insulating layer between the gate and the substrate. A spacer is formed on a sidewall of the gate such that upper edges of the gate are exposed. An elevated silicide source/drain is formed on the substrate adjacent to the gate. A polycrystalline silicon layer is formed above the spacer and covers the upper surface and the upper edges of the gate.

According to another aspect of the present invention, there is provided a method of manufacturing a SB transistor. The method comprises: forming a gate on a substrate with a gate insulating layer between the gate and the substrate; forming a spacer on a sidewall of the gate; growing a polycrystalline silicon layer and a monocrystalline silicon layer on the gate and the substrate, respectively, using a selective silicon growth; depositing a metal both on the polycrystalline silicon layer and the monocrystalline silicon layer; and reacting the metal with silicon of the polycrystalline silicon layer and the monocyrstalline silicon layer to form a self-aligned metal silicide layer.

According to the present invention, a polycrystalline silicon layer is formed on the top of a gate using a selective silicon growth. The polycrystalline silicon layer covers an upper surface and upper edges of the gate. Therefore, a spacer produces a shadow area, i.e., an area on which a metal for silicidation is not deposited. Since the shadow area electrically insulates the gate and the source/drain, a selective wet etching process for removing an unreacted metal can be omitted. In addition, a monocrystalline silicon layer grown on a substrate can decrease etching damage caused during spacer etching.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. To facilitate understanding, identical reference numerals have been used, where possible, to designate identical elements that are common to the figures.

Figure 1:
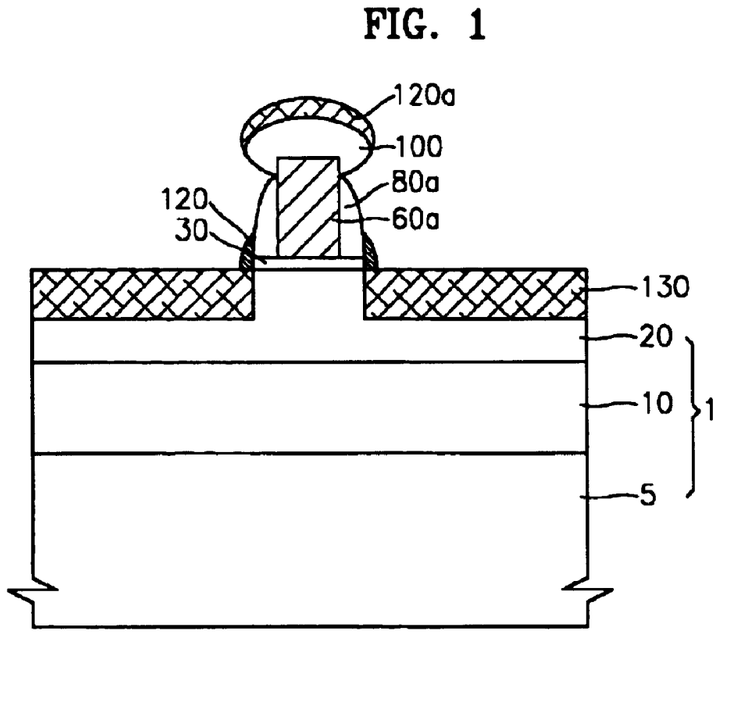
FIG. 1 is a sectional view of a SB transistor according to an embodiment of the present invention.

FIG. 1 is a sectional view of a SB transistor according to an embodiment of the present invention. Referring to FIG. 1, entire structures are formed on a silicon on insulator (SOI) wafer 1. The SOI wafer 1 has a sequentially stacked structure of a base silicon layer 5, a buried oxide layer 10 as an insulating layer, and an ultra-thin monocrystalline silicon layer 20. A gate 60a is formed on the SOI wafer 1 while a gate insulating layer 30 is interposed between the gate 60a and the SOI wafer 1. The gate 60a may be made of polycrystalline silicon doped with an impurity at a high concentration, or metal such as tungsten or aluminum. A spacer 80a made of an insulating material is formed on a sidewall of the gate 60a such that the upper edges of the gate 60a are exposed.

An elevated silicide source/drain 130 is formed on the SOI wafer 1 adjacent to the gate 60a by growing a silicon monocrystalline layer on the SOI wafer 1, followed by silicidation. The spacer 80a prevents a short circuit between the gate 60a and the source/drain 130.

A polycrystalline silicon layer 100 is formed above the spacer 80a and covers the upper surface and the upper edges of the gate 60a. A silicide layer 120a may be formed on the polycrystalline silicon layer 100. Here, the source/drain 130 and the silicide layer 120a are made of metal silicide such as cobalt, tungsten, nickel, palladium, platinum, or titanium silicide.

The polycrystalline silicon layer 100 formed on the top of the gate 60a covers the upper surface and the upper edges of the gate 60a. Therefore, when a metal for silicidation is deposited, the spacer 80a produces a shadow area, i.e., an area on which the metal is not deposited. The shadow area prevents a connection between the silicide layer 120a and the source/drain 130, which makes it possible to omit a selective wet etching process for removal of a residual metal after the silicidation.

FIGS. 2 through 11 are sectional views that illustrate a process of manufacturing a SB transistor according to an embodiment of the present invention.

Figure 2:
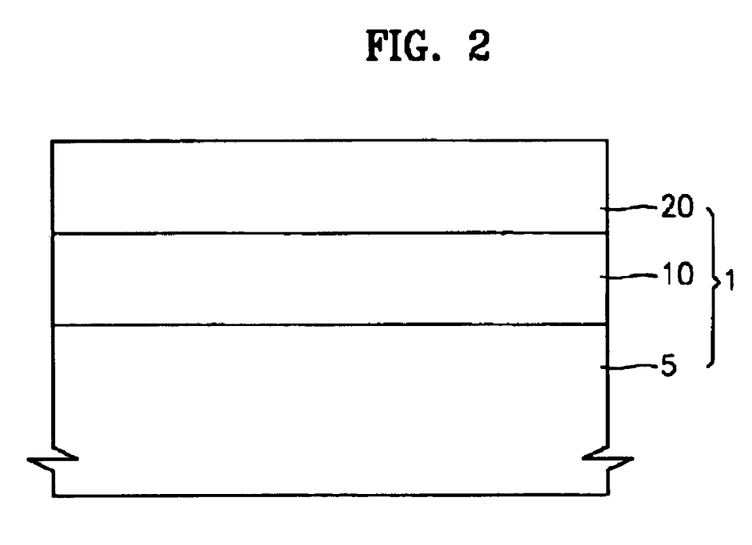
FIGS. 2 through 11 are sectional views that illustrate a process of manufacturing a SB transistor according to an embodiment of the present invention.

A conventional silicon substrate may be used. However, considering that an ultra-small SB transistor can be optimally fabricated with a minimal leakage current, using a SOI wafer is preferred. Referring to FIG. 2, a SOI wafer 1 is generally obtained by forming a buried oxide layer 10 on a base silicon layer 5 and forming an ultra-thin monocrystalline silicon layer 20 on the buried oxide layer 10.

Figure 3:
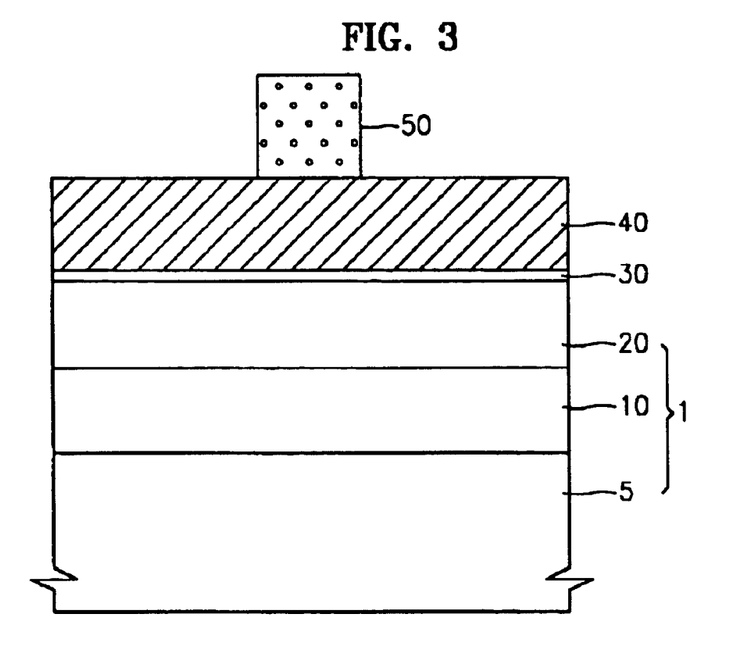

Referring to FIG. 3, a gate insulating layer 30 is formed on the SOI wafer 1 and a conductive layer 40 for formation of a gate electrode is formed on the gate insulating layer 30. The gate insulating layer 30 may be an oxide layer such as a silicon oxide layer, a titanium oxide layer, or a tantalum oxide layer. The gate insulating layer 30 may be formed using a conventional deposition method such as chemical vapor deposition (CVD), sub-atmospheric CVD (SACVD), low pressure CVD (LPCVD), or plasma enhanced CVD (PECVD). Alternatively, the gate insulating layer 30 may be an oxide layer formed by thermally oxidizing the monocrystalline silicon layer 20. The conductive layer 40 may be a polycrystalline silicon layer doped with an impurity at a high concentration or a metal layer. The polycrystalline silicon layer doped with an impurity at a high concentration may be formed using LPCVD at a temperature of 500 to 700° C. The polycrystalline silicon layer doped with an impurity at a high temperature may have conductivity due to the deposition of pure polycrystalline silicon, followed by ion implantation of arsenic (As) or phosphorus (P). Alternatively, an impurity may be in-situ doped during the deposition. The conductive layer 40 may be made of tungsten or aluminum. Then, a photoresist is applied on the conductive layer 40, followed by exposure to light and developing, to form a mask 50 for patterning a gate.

Figure 4:
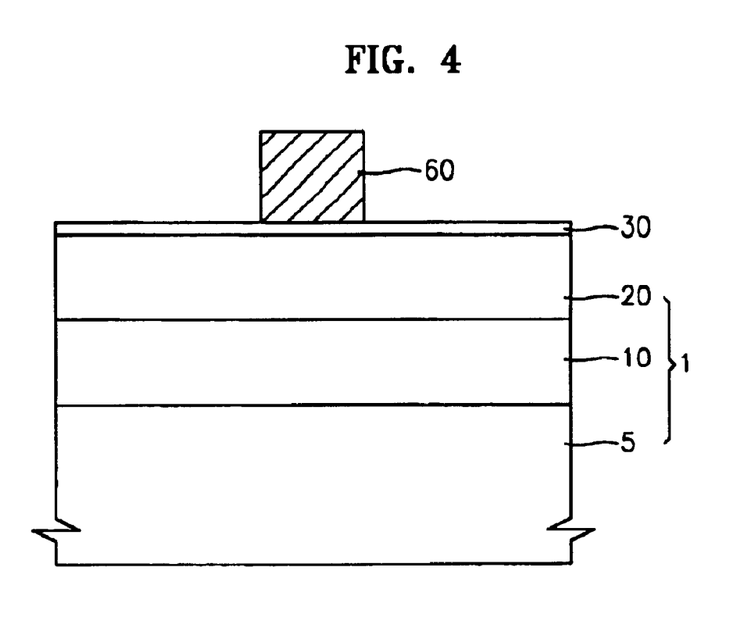

The conductive layer 40 is etched by reactive ion beam etching (RIE) using the mask 50 to form a gate 60. FIG. 4 shows a wafer structure after removal of the mask 50.

Figure 5:
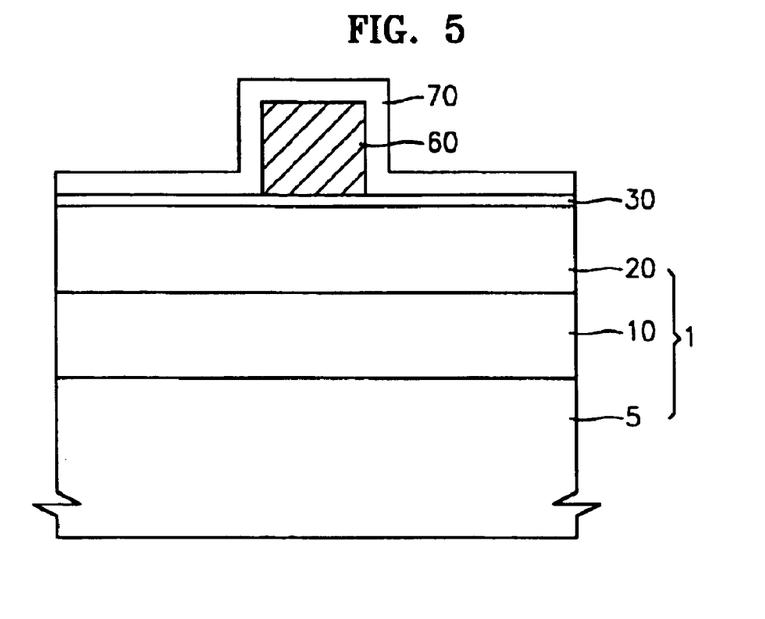
Figure 6:
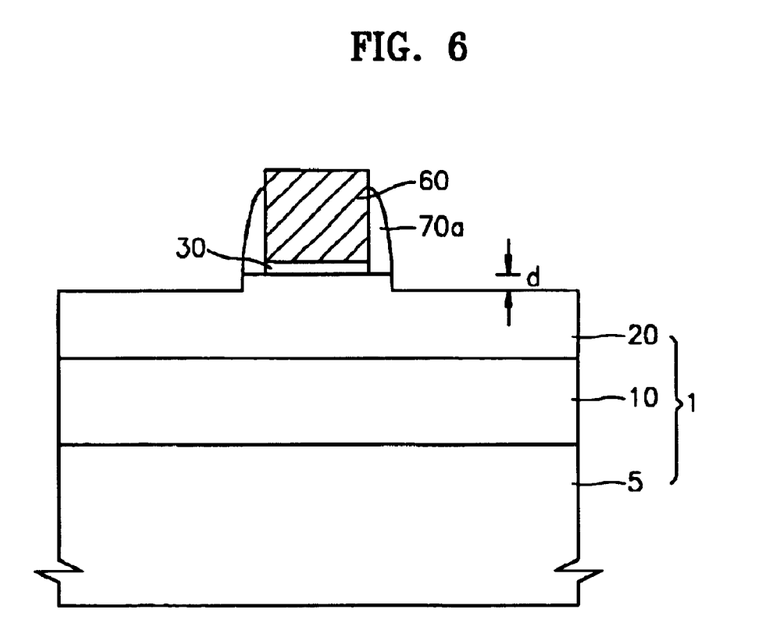

Formation of an insulating spacer for prevention of a short circuit between the gate and the source/drain is indispensable for completion of the structure of a SB transistor. In this regard, two methods for spacer formation are shown in FIGS. 5 and 6, and FIGS. 7 and 8, respectively. Referring to FIGS. 5 and 6, according to a first method, an insulating layer 70 is formed on the gate 60 using LPCVD (see FIG. 5) and then anisotropically etched using RIE to form a spacer 70a on a sidewall of the gate 60 (see FIG. 6). The insulating layer 70 may be a silicon nitride layer. In this case, the silicon nitride layer is formed by reaction of $SiH_4$ and $NH_3$ at a temperature of 500 to 850° C. The depth to which the insulating layer 70 is etched is proportional to the height of the gate 60. However, considering a subsequent process, it is preferable to further etch the substrate, i.e., the monocrystalline silicon layer 20, as much as a thickness d of 200 to 500 Å. Also, it is preferable to form the spacer 70a so that gate materials of the upper edges of the gate 60 are exposed. The upper edges of the gate may also be exposed after the formation of the spacer 70a by a mild wet etching, or an in-situ cleaning at an initial stage of a selective silicon growth as will be described later.

Figure 7:
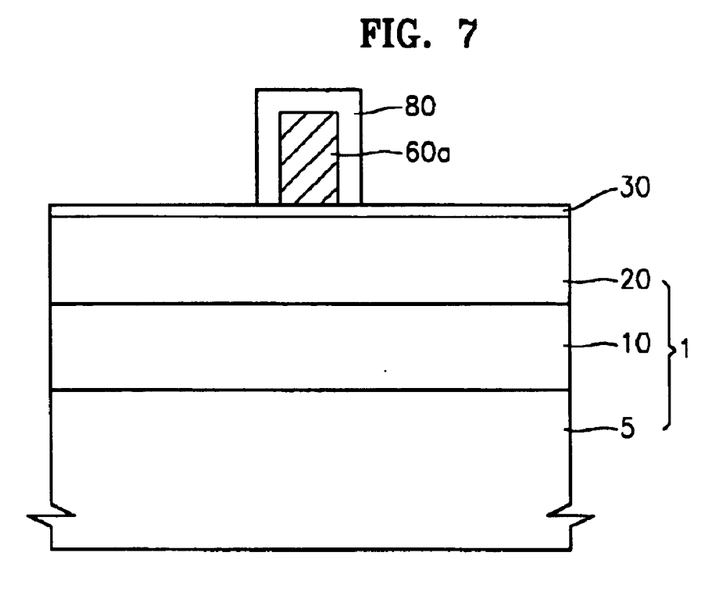
Figure 8:
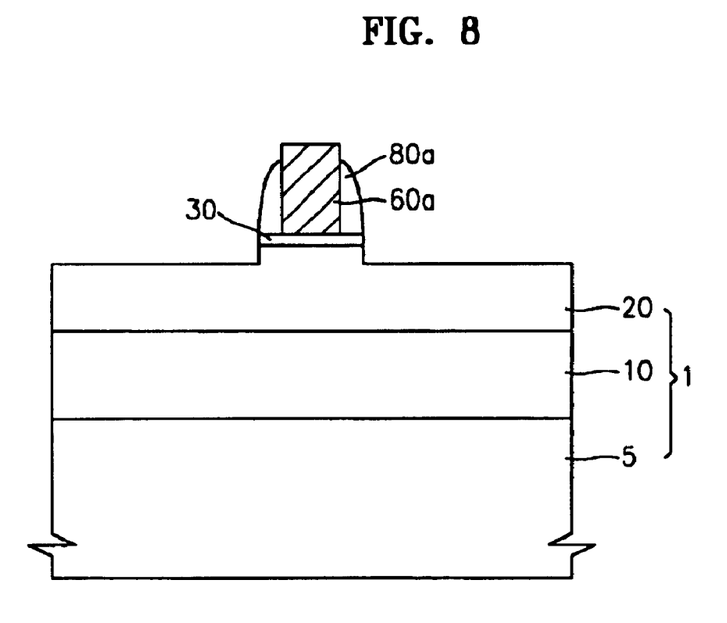

Referring to FIGS. 7 and 8, according to a second method, the gate 60 is thermally oxidized to form a thermal oxidation layer 80 (see FIG. 7), followed by RIE, to form a spacer 80a (see FIG. 8). Although the thermal oxidation process shown in FIGS. 7 and 8 is a high-temperature process, it is advantageous since a gate 60a with a narrow width is formed. Similar to the above first method, the depth to which the thermal oxidation layer 80 is etched is proportional to the height of the gate 60a. However, it is preferable to further etch the monocrystalline silicon layer 20 as much as a thickness d of 200 to 500 Å. Also, it is preferable to form the spacer 80a so that gate materials of the upper edges of the gate 60a are exposed. The upper edges of the gate may also be exposed after the formation of the spacer 80a by a mild wet etching, or an in-situ cleaning at an initial stage of the selective silicon growth.

Figure 9:
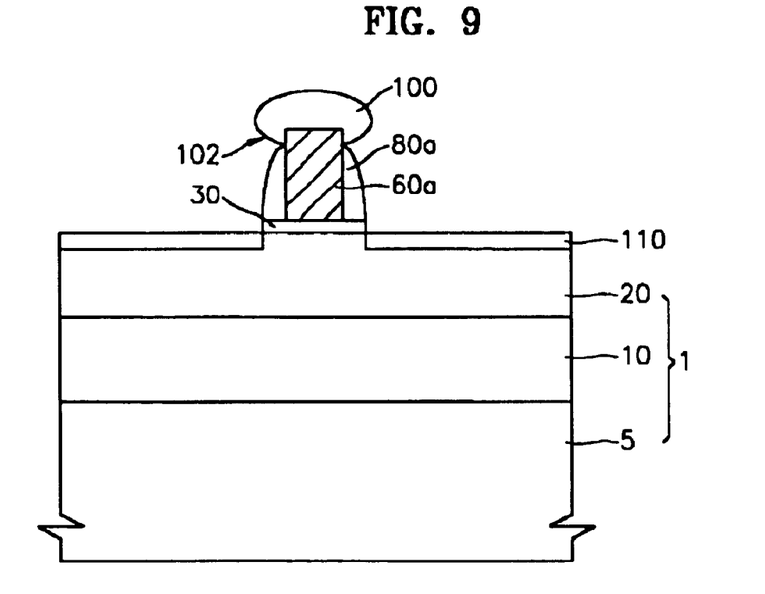
Figure 10:
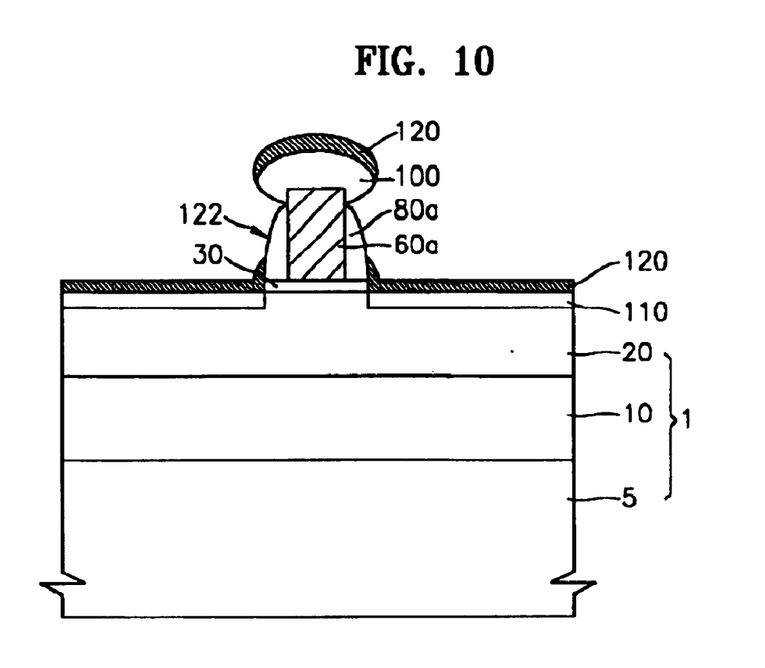
Figure 11:
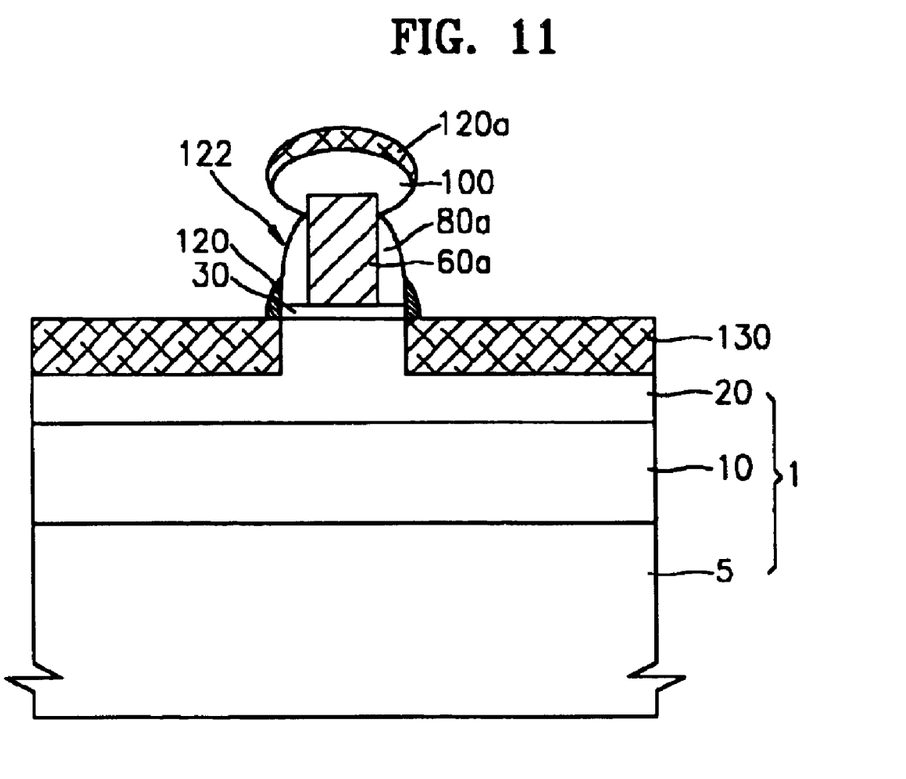

FIGS. 9 through 11 show processes subsequent to the process of FIG. 8. However, it is understood by one of ordinary skill in the art that the processes of FIGS. 9 through 11 can be those subsequent to the process of FIG. 6.

FIGS. 9 through 11 are sequential illustrations of the most important processes of the present invention. After the formation of the spacer 80a, a polycrystalline silicon layer 100 is formed on the gate 60a and a monocrystalline silicon layer 110 is formed on an area of the wafer intended for source/drain formation using a selective silicon growth, as shown in FIG. 9. The polycrystalline silicon layer 100 is formed to a thickness of 200 to 500 Å. As mentioned above, when the gate materials of the upper edges of the gate 60a are not exposed during the formation of the spacer 80a of FIG. 7, before the selective silicon growth, a mild wet etching process or an in-situ cleaning process is carried out to expose the upper edges of the gate 60a.

When the selective silicon growth is carried out in a LPCVD system, $H_2$-baking is carried out for the in-situ cleaning process to expose the upper edges of the gate 60a. At this time, the $H_2$-baking is preferably carried out at a temperature of 700 to 900° C., at a $H_2$ flow rate of 0.5 to 50 slm, at a pressure as low as 0.1 to 10 Torr, and for 60 to 300 seconds. Then, the selective silicon growth is carried out using dichlorosilane (DCS, $SiCl_2H_2$), HCl, and $H_2$ as a process gas. A flow rate of the DCS may be 0.1 to 2 slm, a flow rate of the HCl may be 0 to 3 slm, a flow rate of the $H_2$ may be 10 to 150 slm, a process temperature may be 780 to 930° C., and a process pressure may be 20 to 250 Torr. In particular, it is preferable to decrease the process pressure when the process temperature decreases.

When the selective silicon growth is carried out in an ultra high vacuum-chemical vapor deposition (UHV-CVD) system, the in-situ cleaning is also carried out in the UHV-CVD system instead of the LPCVD system. Vacuum cleaning is carried out for the in-situ cleaning to expose the upper edges of the gate 60a. In this case, the vacuum cleaning may be carried out at a temperature of 650 to 800° C., at an ultra-high vacuum of 10 Torr or less, and for 60 to 300 seconds. Process gases for the selective silicon growth may be $Si_2H_6$ or $SiH_4$, $Cl_2$, and $H_2$. A flow rate of the $Si_2H_6$ or $SiH_4$ may be 1 to 10 sccm, a flow rate of the $Cl_2$ may be 0 to 5 sccm, and a flow rate of the $H_2$ may be 0 to 20 sccm. A process temperature may be in the range of 500 to 750° C. and a process pressure may be in the range of 0.1 to 50 mTorr.

When the selective silicon growth is carried out under the above-described process conditions, the thickness of the polycrystalline silicon layer 100 grown laterally from the upper portions of the side surfaces of the gate 60a is 1.5 to 2 times greater than that of the monocrystalline silicon layer 110. This is because the selective silicon growth is facilitated at the polycrystalline silicon doped with an impurity at a high concentration or the metal used as a gate material. Therefore, a sharp negative slope 102 is formed at the lower surface of the polycrystalline silicon layer 100, as shown in FIG. 9.

Subsequent to the selective silicon growth, a schottky barrier metal 120 is deposited, as shown in FIG. 10. Due to the negative slope of the polycrystalline silicon layer 100, the spacer produces a shadow area 122 corresponding to an area on which the schottky barrier metal is not deposited. The schottky barrier metal 120 may be cobalt, tungsten, nickel, palladium, platinum, or titanium. The schottky barrier metal 120 may be deposited using a physical deposition method, such as sputtering, evaporation, molecular beam epitaxy, ionized cluster beam deposition (ICP), or laser induced physical deposition. The schottky barrier metal 120 is deposited to a thickness of 50 to 500 Å.

Next, as shown in FIG. 11, when a thermal treatment is carried out, a silicide layer 120a is formed above the gate 60a. At the same time, an elevated source/drain 130 made of silicide is formed on the surface of the SOI wafer adjacent to the gate 60a. The thermal treatment for the silicide formation may be carried out at 300 to 600° C. in a thermal process furnace for 0.5 to 2 hours. Alternatively, a rapid thermal process system may be used. In this case, the thermal treatment may be carried out at 800 to 1,200° C. for 1 to 30 seconds.

Even though the schottky barrier metal 120 remains on some portions of the spacer 80a, the shadow area 122 electrically insulates the gate 60a from the source/drain 130. That is, a selective wet etching process for the removal of an unreacted metal can be omitted. The growth of the monocrystalline silicon layer 110 decreases etching damage caused during the formation of the spacer 80a, thereby improving the electrical characteristics of devices.

Figure 12:
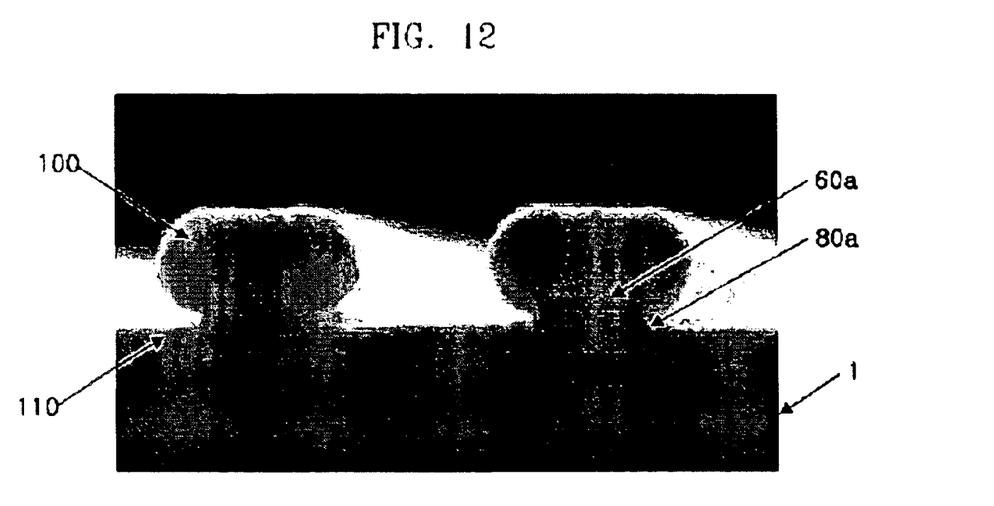
FIG. 12 is a scanning electron microscope (SEM) image of a substrate that has underwent selective silicon growth according to an experimental embodiment of the present invention.

FIG. 12 is a scanning electron microscope (SEM) image of a wafer that has underwent selective silicon growth according to an experimental embodiment of the present invention.

As is apparent from the above description, since ion implantation is not involved in the fabrication of the SB transistor according to the present invention, various processes associated with the ion implantation can be omitted. Therefore, a production cost curtailment is anticipated. Also, since the SB transistor according to the present invention is operated according to quantum mechanics, it can be efficiently applied to quantum devices.

In addition, the selective silicon growth in the fabrication of an ultra-small SB transistor provides the following advantages.

First, a process can be optimized. The growth of a polycrystalline silicon layer from the upper edges of a gate produces an area of a spacer on which a metal is not deposited. Therefore, selective wet etching for the removal of an unreacted metal can be omitted. The growth of a monocrystalline silicon layer on a substrate decreases spacer etching damage at a source/drain, thereby improving device characteristics. While a conventional selective wet etching cannot be carried out when noble metals are used or fine patterns are formed, the present invention can be applied, even when noble metals are used or fine patterns are formed, thereby extending an application range for devices.

Second, a fabrication process is simplified and improved device characteristics are ensured, thereby contributing to fabrication of ultra-small, high performance semiconductor devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a schottky barrier transistor, comprising:

forming a gate on a substrate with a gate insulating layer between the gate and the substrate;

forming a spacer on a sidewall of the gate;

growing a polycrystalline silicon layer and a monocrystalline silicon layer on the gate and the substrate, respectively, using a selective silicon growth;

depositing a metal on the polycrystalline silicon layer and the monocrystalline silicon layer; and reacting the metal with silicon of the polycrystalline silicon layer and the monocyrstalline silicon layer to form a self-aligned metal silicide layer.

2. The method according to claim 1, wherein the spacer produces an area on which the metal is not deposited by the polycrystalline silicon layer.

3. The method according to claim 2, wherein the silicide layer on the gate and the silicide layer on the substrate are electrically insulated by the area of the spacer on which the metal is not deposited.

4. The method according to claim 1, wherein the gate is made of polycrystalline silicon doped with an impurity at a high concentration or metal.

5. The method according to claim 1, wherein the forming the spacer comprises:

depositing an insulating layer on the gate; and anisotropically etching the insulating layer.

6. The method according to claim 1, wherein the forming the spacer comprises:

thermally oxidizing the gate to form an oxidation layer around the gate; and anisotropically etching the oxidation layer.

7. The method according to claim 6, wherein during the etching, the substrate is etched to a depth of 200 to 500 Å.

8. The method according to claim 7, further comprising exposing the upper edges of the gate using a mild wet etching process.

9. The method according to claim 7, further comprising exposing the upper edges of the gate using an in-situ cleaning process at an initial stage of the selective silicon growth.

10. The method according to claim 9, wherein the in-situ cleaning process is carried out in a low pressure chemical vapor deposition (LPCVD) system at a temperature of 700 to 900° C., a $H_2$ flow rate of 0.5 to 50 slm, a pressure of 0.1 to 10 Torr for 60 to 300 seconds.

11. The method according to claim 10, wherein the growing the polycrystalline silicon layer and the monocrystalline silicon layer is carried out in the LPCVD system, dichlorosilane (DCS, $SiCl_2H_2$), HCl, and $H_2$ are used as a process gas, a flow rate of the DCS is 0.1 to 2 slm, a flow rate of the HCl is 0 to 3 slm, and a flow rate of the $H_2$ is 10 to 150 slm, a process temperature is 780 to 930° C., and a process pressure is 20 to 250 Torr.

12. The method according to claim 11, wherein the process pressure decreases when the process temperature decreases.

13. The method according to claim 9, wherein the in-situ cleaning is carried out in an ultra high vacuum-chemical vapor deposition (UHV-CVD) at a temperature of 650 to 800° C., at an ultra-high vacuum of 10 Torr or less for 60 to 300 seconds.

14. The method according to claim 13, wherein the growing the polycrystalline silicon layer and the monocrystalline silicon layer is carried out in the UHV-CVD system, $Si_2H_6$ or $SiH_4$, $Cl_2$, and $H_2$ are used as a process gas, a flow rate of the $Si_2H_6$ or $SiH_4$ is 1 to 10 sccm, a flow rate of the $Cl_2$ is 0 to 5 sccm, a flow rate of the $H_2$ is 0 to 20 sccm, a process temperature is 500 to 750° C., and a process pressure is 0.1 to 50 mTorr.

15. The method according to claim 1, wherein the polycrystalline silicon layer is formed to a thickness of 200 to 500 Å on the gate.

16. The method according to claim 1, wherein the metal is deposited to a thickness of 50 to 500 Å.

17. The method according to claim 1, wherein the forming the self-aligned metal silicide layer is carried out in a thermal process furnace at 300 to 600° C. for 0.5 to 2 hours.

18. The method according to claim 1, wherein the forming the self-aligned metal silicide layer is carried out in a rapid thermal process system at 800 to 1,200° C. for 1 to 30 seconds.

* * * * *